(12) United States Patent
Lee et al.

(10) Patent No.: US 11,550,371 B2
(45) Date of Patent: Jan. 10, 2023

(54) DISPLAY APPARATUS

(71) Applicant: SAMSUNG DISPLAY CO., LTD., Yongin-si (KR)

(72) Inventors: Daegeun Lee, Hwaseong-si (KR); Sujeong Kim, Asan-si (KR); Jang-Hwang Jeon, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 147 days.

(21) Appl. No.: 16/984,804

(22) Filed: Aug. 4, 2020

(65) Prior Publication Data

US 2021/0181814 A1    Jun. 17, 2021

(30) Foreign Application Priority Data

Dec. 16, 2019    (KR) .................... 10-2019-0168292

(51) Int. Cl.
*H05K 1/18* (2006.01)
*G06F 1/18* (2006.01)
*H05K 1/02* (2006.01)

(52) U.S. Cl.
CPC .............. *G06F 1/189* (2013.01); *G06F 1/182* (2013.01); *H05K 1/02* (2013.01); *H05K 1/189* (2013.01)

(58) Field of Classification Search
CPC .......... H05K 1/02; H05K 1/189; H05K 1/118; H05K 1/147; H05K 2201/0979; H05K 2201/10128; H05K 2201/10977; H05K 2201/05; H05K 2201/0969; H05K 2201/09681; H05K 2201/09409; H05K 2201/09745; H05K 2201/09381; H05K 2201/09709; H05K 2201/09727; H05K 3/328; H05K 3/361; H05K 3/365; G06F 1/189; G06F 1/182; G02F 1/13458;
(Continued)

(56) References Cited

U.S. PATENT DOCUMENTS 6,285,433 B1 * 9/2001 Kawasaki ............. H05K 3/361
                                                                 349/149
6,518,557 B1 * 2/2003 Izumi ..................... H05K 3/323
                                                                 257/676
(Continued)

FOREIGN PATENT DOCUMENTS

KR    10-2015-0129975    11/2015
KR    10-2021-0027704    3/2021

*Primary Examiner* — Roshn K Varghese
(74) *Attorney, Agent, or Firm* — F. Chau & Associates, LLC

(57) ABSTRACT

The present disclosure relates to a display apparatus. The display apparatus may include a display panel, a peripheral region, an electronic component, and a gap-fill layer. The display panel defines a display region. The peripheral region is adjacent to the display region. The peripheral region includes lines and pads. The lines are disposed in the peripheral region, and the pads are connected to the lines. The electronic component includes connecting pads in contact with the pads. The gap-fill layer is between the display panel and the electronic component, between the connection pads, between the pads, and in the openings. Each of the pads may overlap at least two pads of the connection pads, and the openings may overlap between the connection pads, when viewed in a plan view.

20 Claims, 11 Drawing Sheets

(58) Field of Classification Search
CPC ............. G02F 1/13452; H01L 27/3244; H01L 27/3276; H01L 27/3253; H01L 51/52
See application file for complete search history.

(56) References Cited

U.S. PATENT DOCUMENTS

| | | | |
|---|---|---|---|
| 2001/0033355 A1* | 10/2001 | Hagiwara | H05K 3/361 349/152 |
| 2003/0164919 A1* | 9/2003 | Oh | G02F 1/13458 349/149 |
| 2016/0056222 A1* | 2/2016 | Odaka | H05K 3/323 257/72 |

* cited by examiner

DISPLAY APPARATUS

CROSS-REFERENCE TO RELATED APPLICATIONS

This U.S. non-provisional patent application claims priority under 35 U.S.C. § 119 to Korean Patent Application No. 10-2019-0168292, filed on Dec. 16, 2019, in the Korean Intellectual Property Office, the contents of which are incorporated by reference herein in their entirety.

BACKGROUND OF THE INVENTION

The present disclosure relates to a display apparatus, and in particular, to a display apparatus with increased bonding reliability.

Televisions, mobile phones, tablet computers, navigation systems, gaming machines, and the like use display devices to convey information to a user. These display devices may contain a display panel. The display panel includes electrical lines for transmitting electrical signals. The display device may also contain other electronic components that provide the electrical signals. The electrical signals are used to display an image on the display panel.

The electronic components may be connected to the display panel through a conductive film or by other bonding methods. Some boding methods increase the conduction property between the display panel and the electronic components. In some cases, the bonding methods may be unreliable. Therefore, there is a need in the art for systems and methods to increase bonding reliability between a display panel and other electronic components.

SUMMARY

An embodiment of the inventive concept provides a display apparatus with increased bonding reliability.

According to an embodiment of the inventive concept, a display apparatus may include a display panel comprising a display region and a peripheral region adjacent to the display region, and further comprising lines disposed in the peripheral region, and pads which are respectively connected to the lines, and wherein each of the pads comprise one or more openings; an electronic component including connection pads in contact with the pads; and a gap-fill layer disposed between the display panel and the electronic component, between the connection pads, between the pads, and in the openings, wherein each of the pads overlaps at least two pads of the connection pads, and each of the openings overlaps a region between the connection pads in a plan view.

In an embodiment, the gap-fill layer may have a non-conductive property and includes a photo-initiator. In an embodiment, the electronic component may further include a base film. The connection pads may be disposed on a surface of the base film, may be extended in a first direction, and may be arranged in a second direction crossing the first direction.

In an embodiment, the openings in each of the pads may be spaced apart from each other by a specific distance in each of the first and second directions. In an embodiment, the openings may be arranged side by side in the second direction. In an embodiment, the openings may be arranged in a zigzag shape in the second direction. In an embodiment, the openings in each of the pads may be extended in the first direction and may be spaced apart from each other by a specific distance in the second direction.

In an embodiment, widths of end portions of the pads connected to the lines may be substantially equal to widths of opposite ends of the pads, which are opposite to the end portions of the pads. In an embodiment, widths of end portions of the pads connected to the lines may be greater than widths of opposite ends of the pads, which are opposite to the end portions of the pads.

According to an embodiment of the inventive concept, a display apparatus may include a display panel comprising a display region and a peripheral region adjacent to the display region, and further comprising lines disposed in the peripheral region, and pads which are respectively connected to the lines, and wherein each of the pads includes a plurality of openings; an electronic component including connection pads electrically connected to the pads, respectively; and a gap-fill layer disposed between the display panel and the electronic component and in the openings, wherein each of the pads overlaps a plurality of the connection pads, and the openings do not overlap the connection pads.

In an embodiment, the gap-fill layer may have a non-conductive property and includes a photo-initiator. In an embodiment, the pads may be in direct contact with the connection pads.

According to an embodiment of the inventive concept, a display apparatus may include a display panel, in which comprising a display region and a peripheral region adjacent to the display region are defined, the display panel further comprising lines, which are disposed in the peripheral region, and pads, which are respectively connected to the lines; and an electronic component comprising connection pads, wherein the connection pads are, which are disposed on the pads and are in contact with the pads, respectively, wherein each of the pads comprises one or more overlap regions, which that overlap the connection pads, and one or more non-overlap regions, which that are do not overlapped with the connection pads, and wherein each of the non-overlap regions of the pads have include one or more openings.

In an embodiment, the display apparatus may further include a gap-fill layer disposed between the display panel and the electronic component, between the connection pads, between the pads, and in the openings. In an embodiment, the gap-fill layer may have a non-conductive property and includes a photo-initiator. In an embodiment, each of the pads may overlap a plurality of the connection pads.

In an embodiment, the electronic component may further include a base film, and the connection pads may be disposed on a surface of the base film, may be extended in a first direction, and may be arranged in a second direction crossing the first direction.

In an embodiment, the overlap regions and the non-overlap regions, which are respectively defined in each of the pads, may be alternately disposed in the second direction. In an embodiment, the openings may be provided in each of the non-overlap regions to be spaced apart from each other by a specific distance in the first direction. In an embodiment, each of the openings may be provided in each of the non-overlap regions to be extended in the first direction.

According to an embodiment of the inventive concept, a display apparatus may include a display panel including one or more pads, wherein each of the pads includes one or more openings; an electronic component including a plurality of connection pads in contact with the pads, wherein each of the pads overlaps at least two pads of the connection pads; and a gap-fill layer disposed between the display panel and the electronic component, between the connection pads, and in the openings, wherein each of the openings overlaps a region between the connection pads and is configured to enable curing of the gap-fill layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
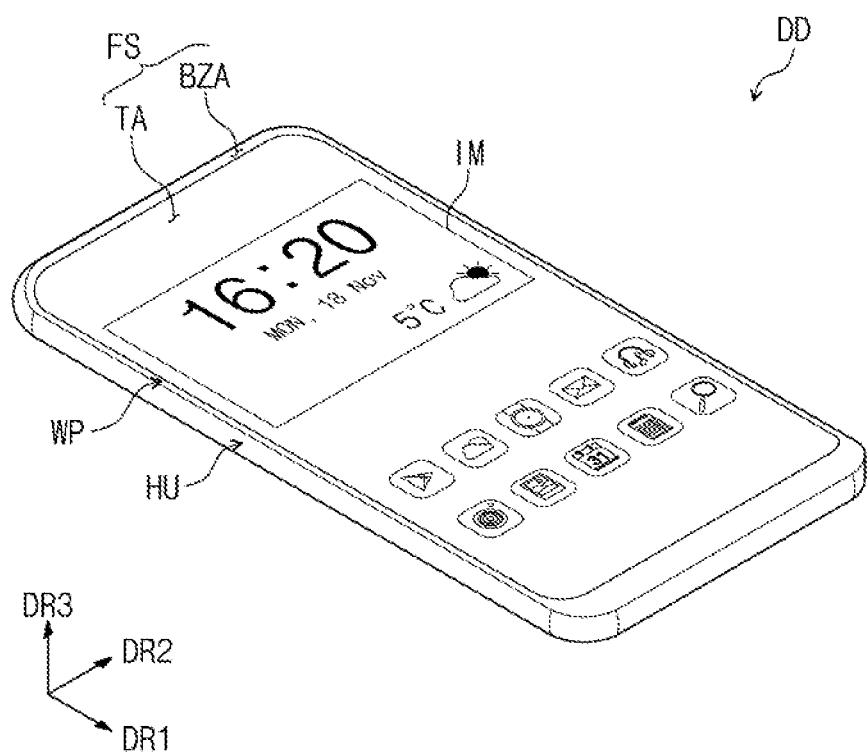
FIG. 1 is a perspective view illustrating display apparatus according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure relates to a display apparatus. More specifically, to a bonding method of a display apparatus. The display apparatus may include a display panel, a peripheral region, an electronic component, and a gap-fill layer. Embodiments of the present disclosure present the peripheral region as adjacent to the display region. The peripheral region includes lines and pads. The lines are disposed in the peripheral region, and the pads are connected to the lines.

According to embodiments of the present disclosure, the display panel includes an electronic component including connection pads connected to the pads, and a filling layer interposed between the display panel and the electronic component. In some embodiments, each of the pads may overlap with at least two connection pads. Openings may be defined in each of the pads, and when viewed on a plane, the openings can be located between the connection pads.

In some examples, a filling layer may be interposed between the pads and the connection pads. The openings in the pads may facilitate curing of the filling layer. Embodiments of the present disclosure prevent bonding degradation that occurs when the filling layer is insufficiently cured.

The display panel may also include signal lines and pixels connected to the signal lines. The display apparatus includes an electronic component providing electrical signals, which are used for to display an image on the display panel.

The electronic component may be electrically connected to the display panel through an anisotropic conductive film or by using an ultrasonography or laser bonding method. In the case where the ultrasonography or laser bonding method is used to connect the display panel to the electronic component, it is possible to increase the conduction between the display panel and the electronic component and to simplify the fabrication process.

Example embodiments of the inventive concepts will now be described more fully with reference to the accompanying drawings, in which example embodiments are shown.

Example embodiments of the inventive concepts may, however, be embodied in many different forms and should not be construed as being limited to the embodiments set forth herein. Rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements. Therefore, their description will be omitted.

It will be understood that when an element is referred to as being "connected" or "coupled" to another element, the element can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are used to distinguish one element, component, region, layer or section from another element, component, region, layer or section. Therefore, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Therefore, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Therefore, example embodiments of the inventive concepts should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as with a meaning consistent with the term's meaning in the context of the relevant art and will not be interpreted in an idealized or overly formal sense unless expressly so defined herein.

Figure 2:
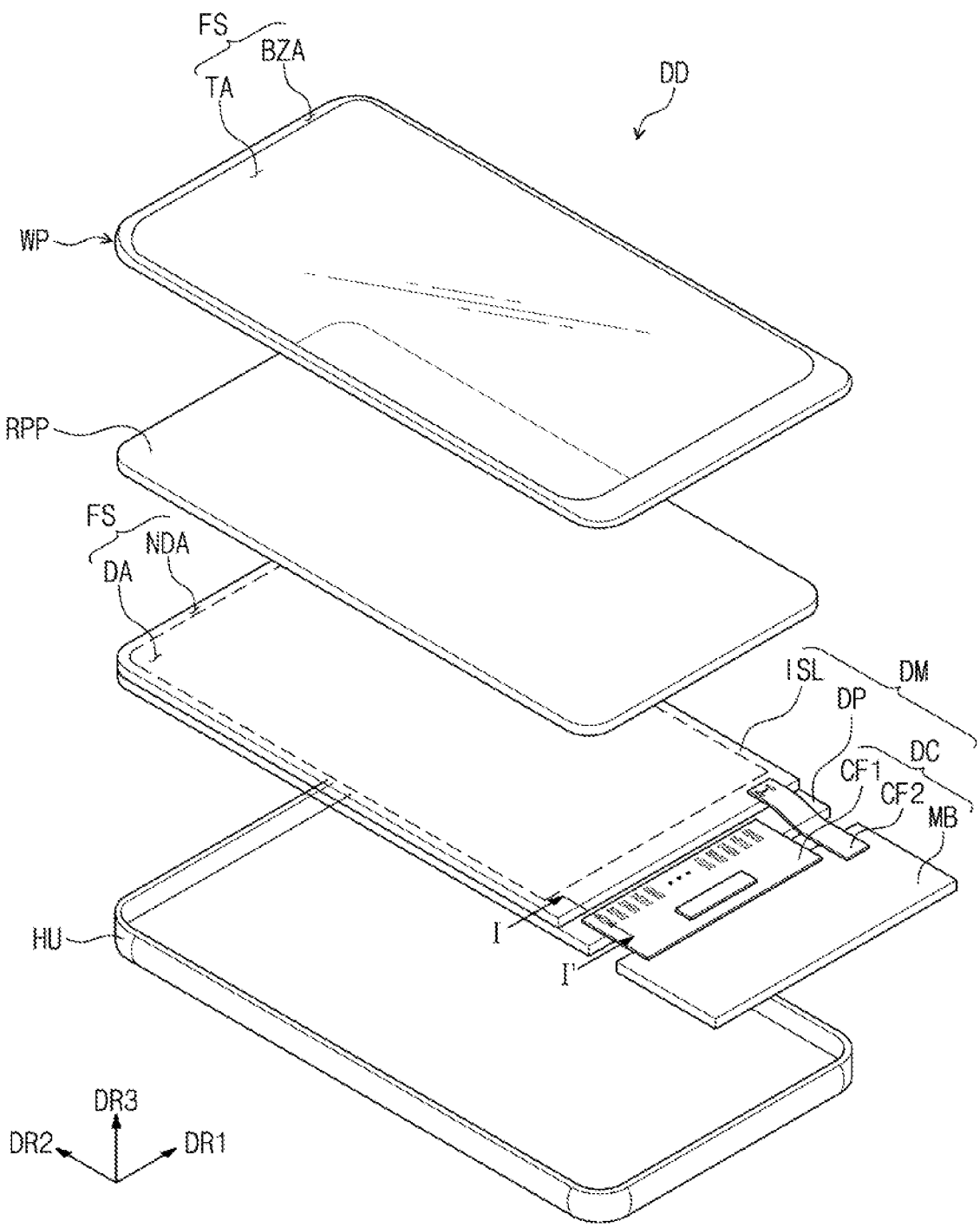
FIG. 2 is an exploded perspective view illustrating display apparatus according to an embodiment of the inventive concept.

FIG. 1 is a perspective view illustrating display apparatus according to an embodiment of the inventive concept, and FIG. 2 is an exploded perspective view illustrating display apparatus according to an embodiment of the inventive concept.

Referring to FIGS. 1 and 2, electrical signals applied thereto may activate a display apparatus DD. The display apparatus DD may be realized in various forms. The display apparatus DD may be used for large-sized electronic devices (e.g., television sets, monitors, and outdoor billboards) or small- or medium-sized electronic devices (e.g., personal computers, notebook computers, personal digital assistants, car navigation systems, game machines, portable electronic devices, and cameras). However, it should be understood that these are merely examples of the inventive concept and that other electronic devices may be realized based on the inventive concept unless the examples do not depart from the inventive concept.

The display apparatus DD may include a display surface FS. The display surface FS is parallel to a first direction DR1 and a second direction DR2 and is used to display an image IM in a third direction DR3. The image IM may be a video image or a still image. FIG. 1A illustrates a clock and icons as an example of the image IM. The display surface FS, on which the image IM is displayed, may correspond to a front surface of the display apparatus DD and to a front surface of a window WP. In an embodiment, according to the structure of the display apparatus DD, at least a portion of a side or rear surface of the display apparatus DD may be used as the display surface FS.

In the present embodiment, a front or top surface and a rear or bottom surface of each element or member may be defined, based on a display direction (e.g., the third direction DR3) of the image IM. The front and rear surfaces may be two opposite surfaces facing each other in the third direction DR3, and a direction normal to each of the front and rear surfaces may be parallel to the third direction DR3. Directions indicated by the first to third directions DR1, DR2, and DR3 may be a relative concept, and in certain embodiments, the first to third directions DR1, DR2, and DR3 may be used to indicate other directions. In the present specification, the expression "when viewed in a plan view" means that the structure under consideration is observed in the third direction DR3.

The display apparatus DD according to an embodiment of the inventive concept may sense a user's input provided from the outside. For example, the user's input may include various types of external inputs, such as a part of a user's body, light, heat, or pressure. However, the inventive concept is not limited to this example or a specific embodiment, and in an embodiment, the display apparatus DD may sense a user's input, which is applied to at least a portion of a side or rear surface of the display apparatus DD, depending on the structure of the display apparatus DD.

The display apparatus DD may include a window WP, an anti-reflection layer RPP, a display module DM, and a housing HU. In the present embodiment, the window WP and the housing HU may be combined to each other to define an outer appearance of the display apparatus DD.

The window WP may be formed of or include an optically transparent insulating material. For example, the window WP may be formed of or include at least one glass or plastic material. The window WP may have a multi- or single-layered structure. For example, the window WP may include a plurality of plastic films, which are combined by an adhesive material, or a glass substrate and a plastic film, which are combined by an adhesive material.

The front surface of the window WP may define the front surface of the display apparatus DD, as described above. The window WP may include a transmission region TA, which is optically transparent. For example, the transmission region TA may be a region whose transmittance to visible light is about 90% or higher.

The window WP may further include a bezel region BZA, which has a relatively low optical transmittance compared with the transmission region TA. The bezel region BZA may define the shape of the transmission region TA. The bezel region BZA may be adjacent to the transmission region TA and may enclose the transmission region TA.

The bezel region BZA may have a predetermined color. The bezel region BZA may cover a peripheral region NDA of the display module DM and may prevent the peripheral region NDA from being recognized by a user. However, the inventive concept is not limited to this example, and in an embodiment, the bezel region BZA may be omitted from the window WP.

The anti-reflection layer RPP may be disposed under the window WP. The anti-reflection layer RPP may reduce the reflectance of an external light, which is incident through the window WP. The anti-reflection layer RPP may be, for example, a polarizing film. In an embodiment, the anti-reflection layer RPP may be omitted. As a result, the anti-reflection layer RPP may be included in the display module DM.

The display module DM may display the image IM and may sense the external input. The display module DM may have a front surface IS, including a display region DA and the peripheral region NDA. The display region DA may be activated by electrical signals applied thereto.

In the present embodiment, the display region DA may be used to display the image IM and to sense an external input. The transmission region TA may overlap at least the display region DA. For example, the transmission region TA may overlap the entire or partial portion of the front surface of the display region DA. Accordingly, a user may watch the image IM through the transmission region TA or may provide an external input to the display module DM through the transmission region TA. However, the inventive concept is not limited to this example, and in an embodiment, the display region DA may include two separate regions, one of which is used to display the image IM, and the other of which is used to sense the external input.

The peripheral region NDA may be a region covered with the bezel region BZA. The peripheral region NDA may be adjacent to an outer border of the display region DA. The peripheral region NDA may enclose the display region DA. A driving circuit or a driving line, which are used to drive the display region DA, may be disposed in the peripheral region NDA.

The display module DM may include a display panel DP, an input-sensing layer ISL, and a driving portion DC.

The display panel DP may be an element that substantially generates the image IM. The image IM, which is generated by the display panel DP, may be provided to an external user through the transmission region TA.

The input-sensing layer ISL may sense an external input provided from the outside. As described above, the input-sensing layer ISL may sense an external input provided to the window WP.

The driving portion DC may be an electronic component electrically connected to the display panel DP and the input-sensing layer ISL. The driving portion DC may include a main circuit substrate MB, a first circuit substrate CF1, and a second circuit substrate CF2.

The first circuit substrate CF1 may be electrically connected to the display panel DP. The first circuit substrate CF1 may connect the display panel DP to the main circuit substrate MB. In the present embodiment, the first circuit substrate CF1 may be a flexible circuit film.

The first circuit substrate CF1 may be coupled to the pads of the display panel DP, which are disposed in the peripheral region NDA. The first circuit substrate CF1 may provide an electrical signal, which is used to drive the display panel DP, to the display panel DP. A circuit may produce the electrical signal in the first circuit substrate CF1 or the main circuit substrate MB.

The second circuit substrate CF2 may be electrically connected to the input-sensing layer ISL. The second circuit substrate CF2 may electrically connect the input-sensing layer ISL with the main circuit substrate MB. In the present embodiment, the second circuit substrate CF2 may be a flexible circuit film, as shown in FIG. 2. However, the inventive concept is not limited to this example, and the second circuit substrate CF2 may not be connected to the main circuit substrate MB or may be omitted. In the case where the second circuit substrate CF2 is omitted, the input-sensing layer ISL may be electrically connected to the first circuit substrate CF1.

The second circuit substrate CF2 may be coupled to the pads of the input-sensing layer ISL, which is disposed in the peripheral region NDA. The second circuit substrate CF2 may provide an electrical signal to the input-sensing layer ISL. The electrical signal is used to drive the input-sensing layer ISL. The electrical signal may be produced by a circuit in the second circuit substrate CF2 or the main circuit substrate MB.

The main circuit substrate MB may include a variety of driving circuits, which are used to drive the display module DM, or a connector, which is used to supply electric power. Each of the first and second circuit substrates CF1 and CF2 may be coupled to the main circuit substrate MB. According to this embodiment, the display module DM may be controlled through the single main circuit substrate MB. However, the inventive concept is not limited to this example, and in an embodiment, the display panel DP and the input-sensing layer ISL of the display module DM may be connected to two different main circuit substrates, respectively, and one the first and second circuit substrates CF1 and CF2 may not be connected to the main circuit substrate MB.

The housing HU may be combined with the window WP. The housing HU may be combined with the window WP to define an internal space therebetween. The display module DM may be disposed in the internal space.

The housing HU may be formed of or include a material with a relatively high stiffness or strength. For example, the housing HU may include at least one of glass, plastic, or metallic materials. Additionally or alternatively, the housing HU may include a plurality of frames and/or plates that are made of the glass, plastic, or metallic materials. The housing HU may stably protect elements of the display apparatus DD, which are disposed in the internal space, from an external impact.

In an embodiment, the display apparatus DD may not include the window WP. In addition, the display module DM may not include the input-sensing layer ISL.

Figure 3:
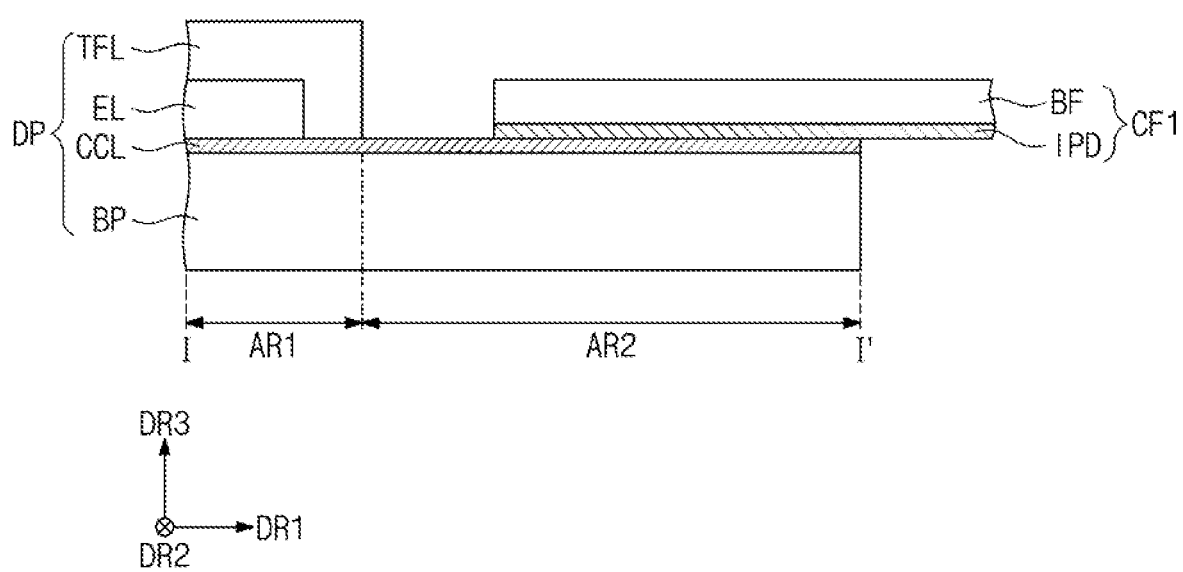
FIG. 3 is a sectional view taken along line I-I' of FIG. 2.

FIG. 3 is a sectional view taken along line I-I' of FIG. 2. To reduce complexity in the drawings, other elements of the display apparatus DD, except for the display panel DP and the first circuit substrate CF1, are omitted from FIG. 3.

Referring to FIG. 3, the display panel DP may include a base substrate BP, a circuit layer CCL, an emission element layer EL, and an encapsulation layer TFL.

The base substrate BP may be a base layer on which the circuit layer CCL is formed. The base substrate BP may be a single layer or may include a plurality of insulating layers. The base substrate BP may include at least one of a glass substrate, a plastic substrate, a film, or a stacking structure including a plurality of organic and/or inorganic layers. However, the inventive concept is not limited to a specific structure of the base substrate BP.

A first region AR1 and a second region AR2, which are sequentially arranged in the first direction DR1, may be defined in the base substrate BP. For example, the first region AR1 and the second region AR2 may be defined in the top surface of the base substrate BP.

The circuit layer CCL may be disposed on the base substrate BP. The circuit layer CCL may have a stacking structure including a plurality of conductive layers and a plurality of organic and/or inorganic layers. For example, the circuit layer CCL may include a plurality of transistors, a plurality of signal lines, and a plurality of insulating layers.

The emission element layer EL may be disposed on the circuit layer CCL. The emission element layer EL may be electrically connected to a driving device and a signal line constituting the circuit layer CCL. In the case where the display panel DP is an organic light-emitting display panel, the emission element layer EL may include an organic light-emitting layer. In the case where the display panel DP is a quantum-dot light-emitting display panel, the emission element layer EL may include quantum dots or quantum rods.

The encapsulation layer TFL may be disposed on the emission element layer EL to cover the emission element layer EL. The encapsulation layer TFL may protect the emission element layer EL. Depending on the kind of the display panel DP, the encapsulation layer TFL may be omitted or may be replaced with an encapsulation substrate.

The first circuit substrate CF1 may be coupled to a portion of the circuit layer CCL, wherein the circuit layer CCL is disposed on the second region AR2 of the base substrate BP. In an embodiment, the portion of the circuit layer CCL may be used as pads.

The first circuit substrate CF1 may include a base film BF and connection pads IPD. The base film BF may have flexible and electrically insulating properties. The connection pads IPD may be electrically connected to the circuit layer CCL.

In an embodiment, the first circuit substrate CF1 may be electrically connected to the circuit layer CCL by an ultrasonography or laser bonding method. For example, the connection pads IPD of the first circuit substrate CF1 may be in direct contact with the pads of the display panel DP by the ultrasonography or laser bonding method.

Figure 4:
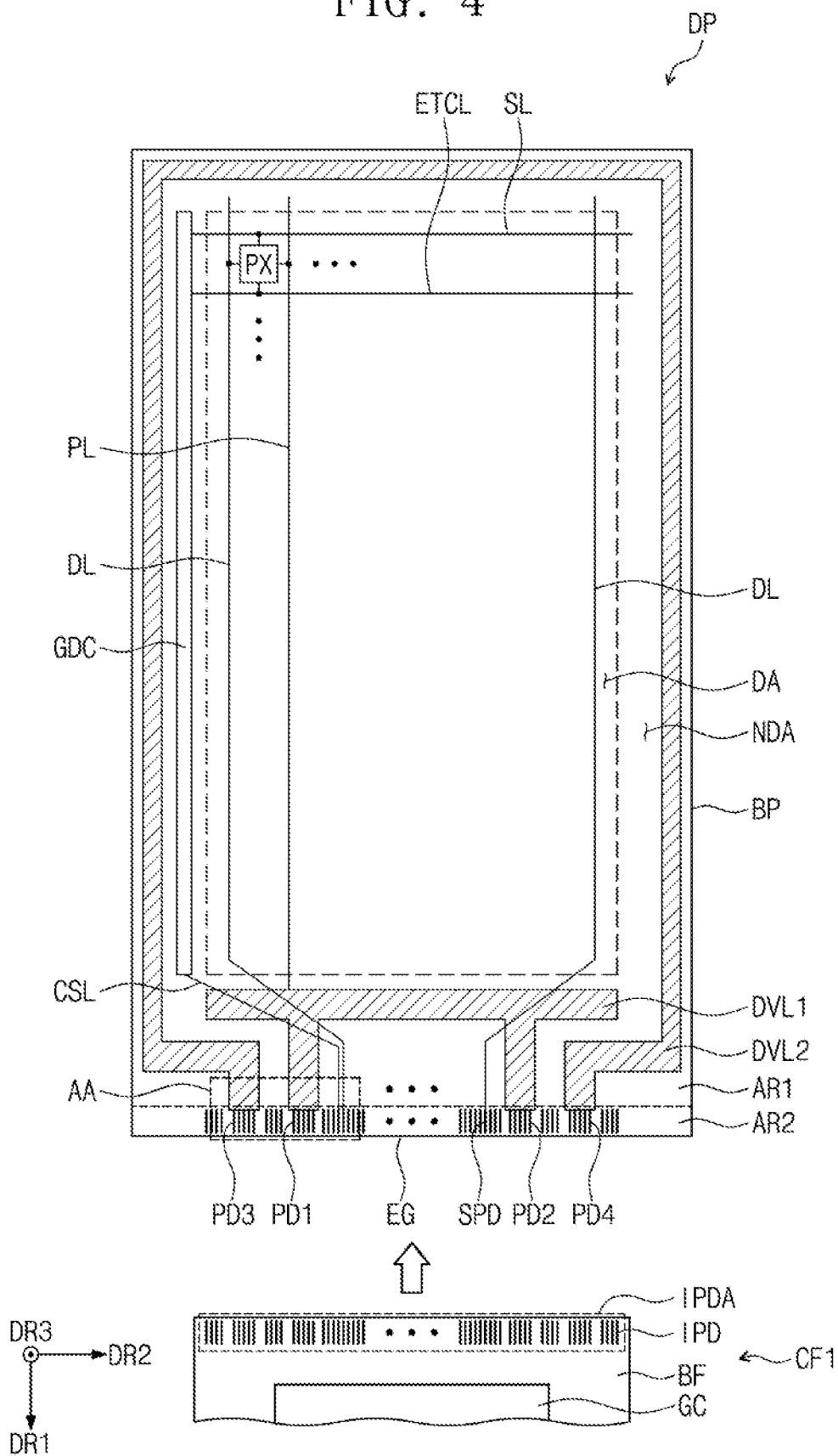
FIG. 4 is a plan view illustrating a portion of a display apparatus according to an embodiment of the inventive concept.

FIG. 4 is a plan view illustrating a portion of a display apparatus according to an embodiment of the inventive concept.

Referring to FIG. 4, the display apparatus DD may include the display panel DP and the first circuit substrate CF1, which is bonded to the display panel DP. FIG. 4 illustrates a structure in which the first circuit substrate CF1 is not bonded to the display panel DP.

The display panel DP may include a base substrate BP, pixels PX, a driving circuit GDC, signal lines SL, ECTL, DL, PL, and CSL, first and second power lines DVL1 and DVL2, signal pads SPD, and power pads PD1, PD2, PD3, and PD4.

The first region AR1 and the second region AR2 of the base substrate BP may be sequentially defined in the first direction DR1. The first region AR1 may overlap the entire region of the display region DA and a portion of the peripheral region NDA. The second region AR2 may overlap another portion of the peripheral region NDA.

The pixels PX may be disposed on the first region AR1. Each of the pixels PX may be configured to display light of a specific color. The pixels PX may include, for example, red pixels, green pixels, and blue pixels. In an embodiment, the pixels PX may further include white pixels. In an embodiment, the pixels PX may further include at least one of cyan pixels, magenta pixels, or yellow pixels.

The driving circuit GDC may be disposed in the peripheral region NDA. The driving circuit GDC may include a scan driving circuit and an emission control driving circuit. The scan driving circuit may generate a plurality of scan signals, and the emission control driving circuit may generate a plurality of emission control signals.

The driving circuit GDC may include a plurality of thin-film transistors that are formed by the same process as that for the pixel driving circuit of the pixels PX (e.g., by a low-temperature polycrystalline silicon (LTPS) process or a low-temperature polycrystalline oxide (LTPO) process).

The signal lines SL, DL, CSL, PL, and ECTL may include scan lines SL, emission control lines ETCL, data lines DL, power lines PL, and control signal lines CSL.

The scan lines SL may be extended in the second direction DR2 and may be arranged in the first direction DR1. The emission control lines ETCL may be extended in the second direction DR2 and may be arranged in the first direction DR1. In other words, each of the emission control lines ETCL may be disposed to be parallel to a corresponding one of the scan lines SL. The scan lines SL may receive scan signals from the driving circuit GDC. The emission control lines ETCL may receive emission control signals from the driving circuit GDC.

The data lines DL may be extended in the first direction DR1 and may be arranged in the second direction DR2. The data lines DL may be used to provide data signals to corresponding ones of the pixels PX.

The power lines PL may be extended in the first direction DR1 and may be arranged in the second direction DR2. The power lines PL may be electrically connected to the first power line DVL1. The power lines PL may provide the first driving voltage to corresponding ones of the pixels PX.

The control signal lines CSL may be electrically connected to the driving circuit GDC. The control signal lines CSL may be used to deliver signals for driving the driving circuit GDC.

Each of the first and second power lines DVL1 and DVL2 may provide the driving voltage to the pixels PX. For example, the first power line DVL1 may receive the first driving voltage (e.g., an ELVDD voltage) and may provide the first driving voltage to the pixels PX through the power lines PL. The second power line DVL2 may receive the second driving voltage (e.g., an ELVSS voltage) and may provide the second driving voltage to second electrodes CE (e.g., see FIG. 5) of the pixels PX. The second driving voltage may have a voltage level lower than that of the first driving voltage.

The signal pads SPD and the power pads PD1, PD2, PD3, and PD4 may be disposed in the second region AR2.

The signal pads SPD may be arranged in the second direction DR2. The signal pads SPD may be connected to some of the signal lines SL, ECTL, DL, PL, and CSL. For example, some of the signal pads SPD may be connected to the control signal lines CSL, and others of the signal pads SPD may be connected to the data lines DL.

The power pads PD1, PD2, PD3, and PD4 may include a first power pad PD1, a second power pad PD2, a third power pad PD3, and a fourth power pad PD4. The power pads PD1, PD2, PD3, and PD4 may be arranged in the second direction DR2.

The first power pad PD1 and the second power pad PD2 may be connected to the first power line DVL1, and the third power pad PD3 and the fourth power pad PD4 may be connected to the second power line DVL2.

A width of each of the first and second power lines DVL1 and DVL2 may be greater than a width of each of the control signal lines CSL and the data lines DL. Therefore, widths of the power pads PD1, PD2, PD3, and PD4, which are respectively connected to the first and second power lines DVL1 and DVL2, may be greater than widths of the signal pads SPD, which are respectively connected to the control signal lines CSL and the data lines DL.

The shapes of the power pads PD1, PD2, PD3, and PD4 will be described in more detail with reference to FIGS. 6A, 6B, 9, 10, and 11.

The first circuit substrate CF1 may include the base film BF and the connection pads IPD.

A connection pad region IPDA may be defined in the base film BF. The connection pad region IPDA may be defined on the bottom surface of the base film BF. The connection pad region IPDA may be defined in an end region of the base film BF adjacent to the display panel DP.

The connection pads IPD may be disposed in the connection pad region IPDA. The connection pads IPD may be extended in the first direction DR1 and may be arranged in the second direction DR2. Widths of the connection pads IPD may be smaller than widths of the power pads PD1, PD2, PD3, and PD4. Here, the width may be a length of an element measured in the second direction DR2.

According to an embodiment of the inventive concept, a plurality of the connection pads IPD may be disposed to correspond to each of the power pads PD1, PD2, PD3, and PD4. Additionally or alternatively, the connection pads IPD may be electrically connected to each of the power pads PD1, PD2, PD3, and PD4. Although not shown, in the case where a low resistance property for at least one of the signal pads SPD is realized, a plurality of the connection pads IPD may be electrically connected to such a signal pad. A driving chip GC may be mounted on the top and bottom surfaces of the base film BF. The driving chip GC may be configured to provide the data signals to the pixels PX.

Figure 5:
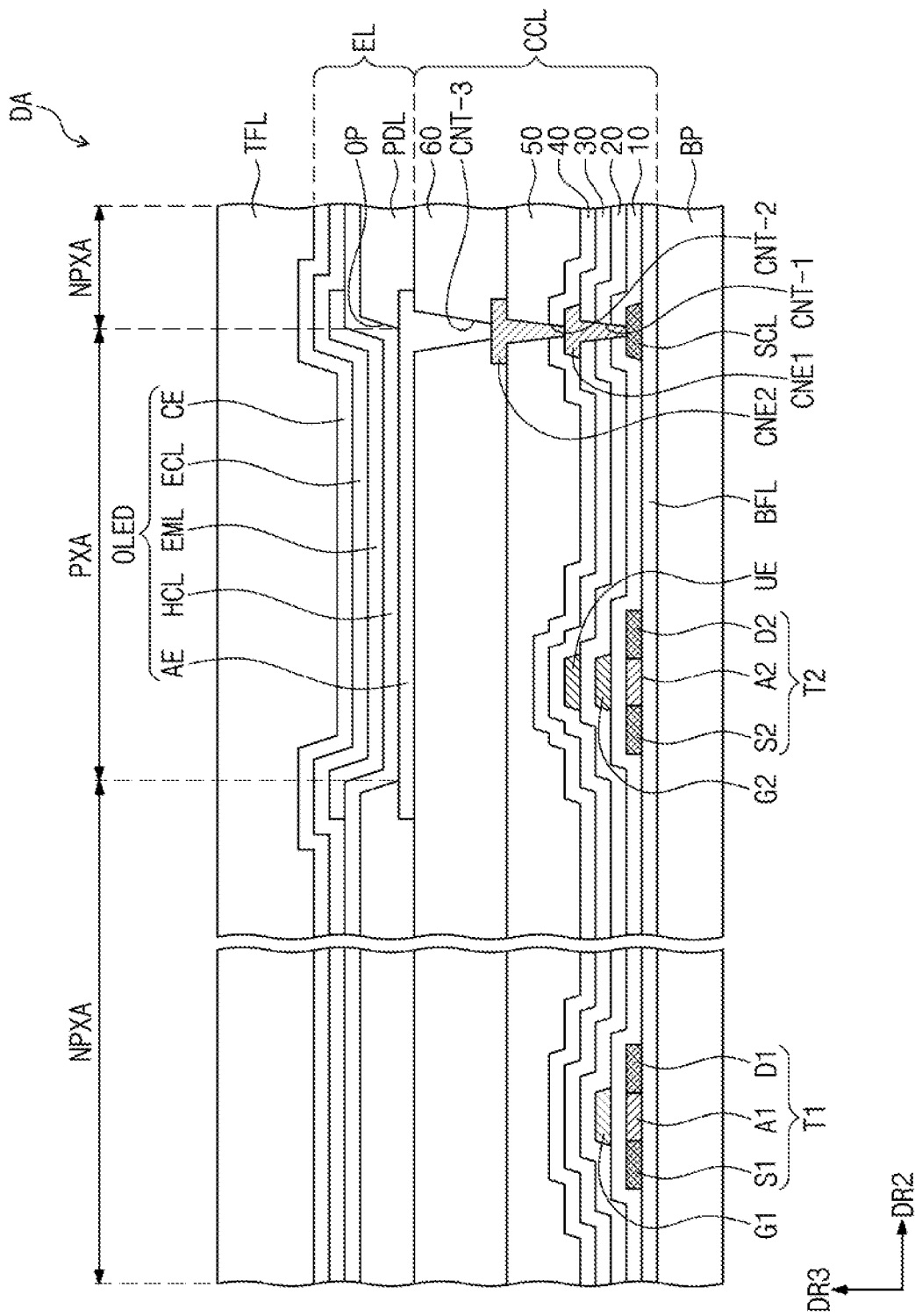
FIG. 5 is a sectional view illustrating a display panel according to an embodiment of the inventive concept.

FIG. 5 is a sectional view illustrating a display panel according to an embodiment of the inventive concept. For example, FIG. 5 is a sectional view illustrating a portion of the pixel PX of FIG. 4.

Referring to FIG. 5, the display panel DP may include the base substrate BP, the circuit layer CCL, the emission element layer EL, and the encapsulation layer TFL. Each of the pixels PX (e.g., see FIG. 4) may include a plurality of transistors, at least one capacitor, and an emission element layer OLED. In an embodiment, the plurality of transistors and the at least one capacitor may be included in the circuit layer CCL.

A buffer layer BFL may be disposed on the base substrate BP. The buffer layer BFL may enhance an adhesive strength between the base substrate BP and a semiconductor pattern. The buffer layer BFL may include at least one silicon oxide layer and at least one silicon nitride layer. The silicon oxide layer and the silicon nitride layer may be alternatingly stacked.

The semiconductor pattern may be disposed on the buffer layer BFL. The semiconductor pattern may be formed of or include polysilicon. However, the inventive concept is not limited to this example, and the semiconductor pattern may be formed of or include at least one of amorphous silicon or metal oxides.

In an embodiment, the semiconductor patterns may be arranged with a certain rules throughout the pixels PX. The electrical characteristics of the semiconductor pattern may be changed depending on its doping state. The semiconductor pattern may include a doped region and an undoped region. The doped region may be doped with n- or p-type dopants. A p-type transistor may include a doped region doped with p-type dopants The doped region may have conductivity higher than the undoped region and may be used as an electrode or a signal line. The undoped region may correspond to an active or channel region of a transistor. In other words, a portion of the semiconductor pattern may be used as the active region of the transistor, another portion may be used as the source or drain electrode of the transistor, and another region may be used as a connection electrode or a connection signal line.

As shown in FIG. 5, a first transistor T1 may include a source region S1, an active region A1, and a drain region D1, each of which is a part of the semiconductor pattern, and a second transistor T2 may include a source region S2, an active region A2, and a drain region D2, each of which is a part of the semiconductor pattern. The source regions S1 and S2 and the drain regions D1 and D2 may be extended from the active regions A1 and A2 in opposite directions, when viewed in a section view. FIG. 5 illustrates a portion of a connection signal line SCL formed from the semiconductor pattern. Although not shown, the connection signal line SCL may be connected to the drain regions D2 of the second transistor T2, when viewed in a plan view.

A first insulating layer 10 may be disposed on the buffer layer BFL. The first insulating layer 10 may overlap the pixels PX and may cover the semiconductor pattern. The first insulating layer 10 may be an inorganic layer and/or an organic layer and may have a single- or multi-layered structure. The first insulating layer 10 may be formed of or include at least one of aluminum oxide, titanium oxide, silicon oxide, silicon oxynitride, zirconium oxide, or hafnium oxide. In the present embodiment, the first insulating layer 10 may be a single-layered silicon oxide layer. The first insulating layer 10 as well as an insulating layer of the circuit layer CCL to be described below may be an inorganic layer and/or an organic layer and may have a single- or multi-layered structure. The inorganic layer may be formed of or include at least one of the above-stated materials.

Gates G1 and G2 may be disposed on the first insulating layer 10. Each of the gates G1 and G2 may be a portion of a metal pattern. The gates G1 and G2 may overlap the active regions A1 and A2. In an embodiment, the gates G1 and G2 may be used as a doping mask in a doping process of the semiconductor pattern.

A second insulating layer 20 may be disposed on the first insulating layer 10 to cover the gates G1 and G2. The second insulating layer 20 may overlap the pixels PX. The second insulating layer 20 may be an inorganic layer and/or an organic layer and may have a single- or multi-layered structure. In the present embodiment, the second insulating layer 20 may be a single-layered silicon oxide layer.

An upper electrode UE may be disposed on the second insulating layer 20 and may overlap the gate G2 of the second transistor T2. The upper electrode UE may be a portion of a metal pattern. A portion of the gate G2 and the upper electrode UE overlapped therewith may define a capacitor.

A third insulating layer 30 may be disposed on the second insulating layer 20 to cover the upper electrode UE and may be a single-layered silicon oxide layer. A first connection electrode CNE1 may be disposed on the third insulating layer 30. The first connection electrode CNE1 may be coupled to the connection signal line SCL through a contact hole CNT-1 penetrating the first to third insulating layers 10 to 30.

A fourth insulating layer 40 may be disposed on the third insulating layer 30 to cover the first connection electrode CNE1 and may be a single-layered silicon oxide layer. A fifth insulating layer 50 may be disposed on the fourth insulating layer 40 and may be an organic layer. A second connection electrode CNE2 may be disposed on the fifth insulating layer 50. The second connection electrode CNE2 may be coupled to the first connection electrode CNE1 through a contact hole CNT-2 penetrating the fourth insulating layer 40 and the fifth insulating layer 50.

A sixth insulating layer 60 may be disposed on the fifth insulating layer 50 to cover the second connection electrode CNE2. The sixth insulating layer 60 may be an organic layer. A first electrode AE may be disposed on the sixth insulating layer 60. The first electrode AE may be connected to the second connection electrode CNE2 through a contact hole CNT-3 penetrating the sixth insulating layer 60. An opening OP may be defined in a pixel definition layer PDL. The opening OP of the pixel definition layer PDL may expose at least a portion of the first electrode AE.

As shown in FIG. 5, the display region DA may include a light-emitting region PXA and a light-blocking region NPXA adjacent to the light-emitting region PXA. The light-blocking region NPXA may enclose the light-emitting region PXA. In the present embodiment, the light-emitting region PXA may be defined to correspond to a region of the first electrode AE exposed by the opening OP.

A hole control layer HCL may be disposed in both of the light-emitting region PXA and the light-blocking region NPXA. The hole control layer HCL may include a hole transport layer and, in an embodiment, the hole control layer HCL may further include a hole injection layer. An emission layer EML may be disposed on the hole control layer HCL. The emission layer EML may be disposed in a region corresponding to the opening OP. For example, the emission layer EML may be formed to include a plurality of separate portions, which are respectively disposed in the pixels.

An electron control layer ECL may be disposed on the emission layer EML. The electron control layer ECL may include an electron transport layer and, in an embodiment, the electron control layer ECL may further include an electron injection layer. The hole control layer HCL and the electron control layer ECL may be formed using an open mask. Therefore, the hole control layer HCL and the electron control layer ECL may be formed in common on a plurality of pixels. A second electrode CE may be disposed on the electron control layer ECL and may be a single pattern which is disposed in the pixels PX.

The encapsulation layer TFL may be disposed on the second electrode CE. A capping layer may be further disposed between the second electrode CE and the encapsulation layer TFL to cover the second electrode CE.

The encapsulation layer TFL may include a first inorganic layer, an organic layer, and a second inorganic layer, which are sequentially stacked. However, the inventive concept is not limited to this example and the encapsulation layer TFL may further include a plurality of inorganic layers and a plurality of organic layers.

Figure 6A:
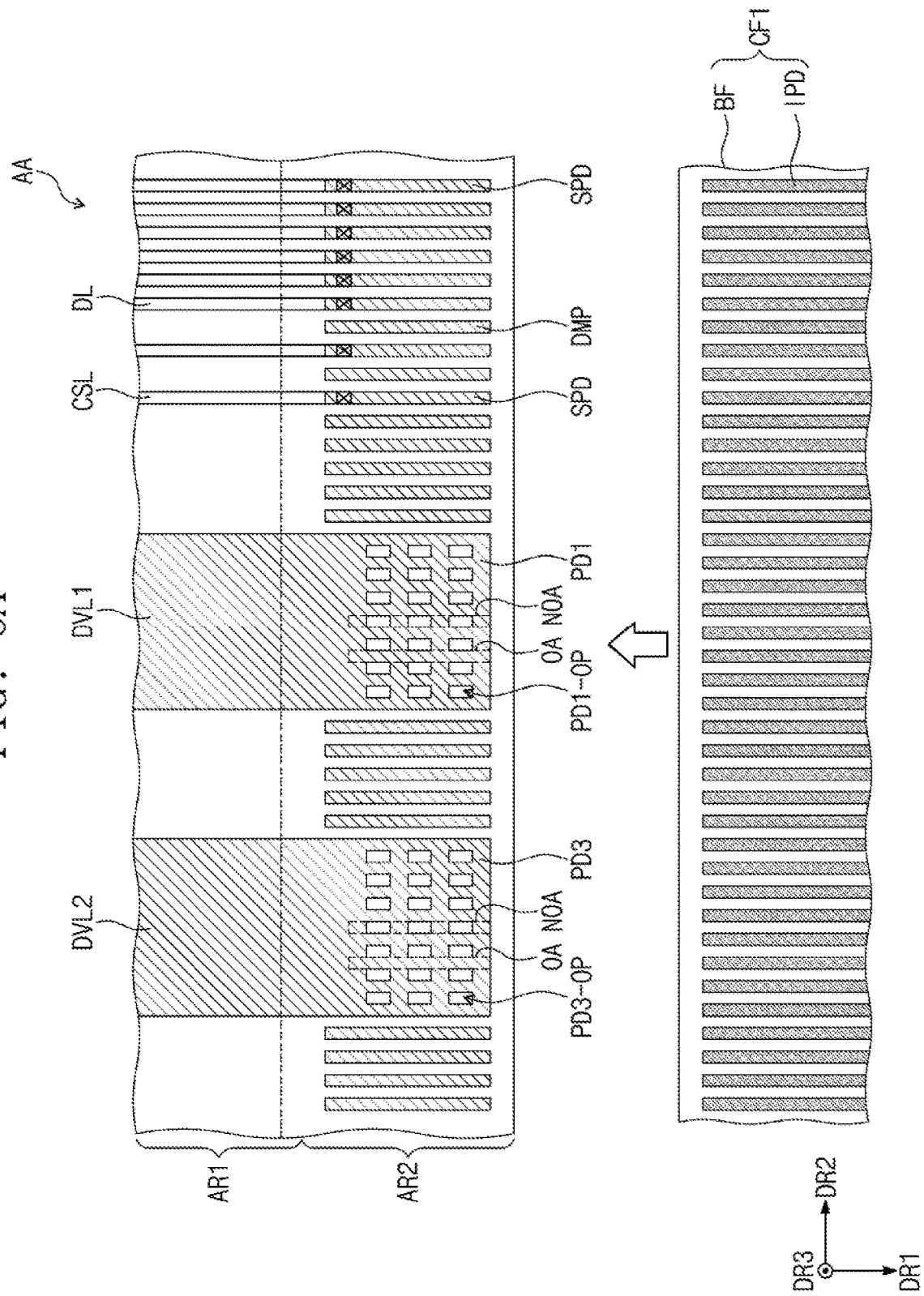
FIGS. 6A and 6B are enlarged plan views illustrating a portion (e.g., taken along a line AA of FIG. 4) of a display apparatus according to an embodiment of the inventive concept.
Figure 6B:
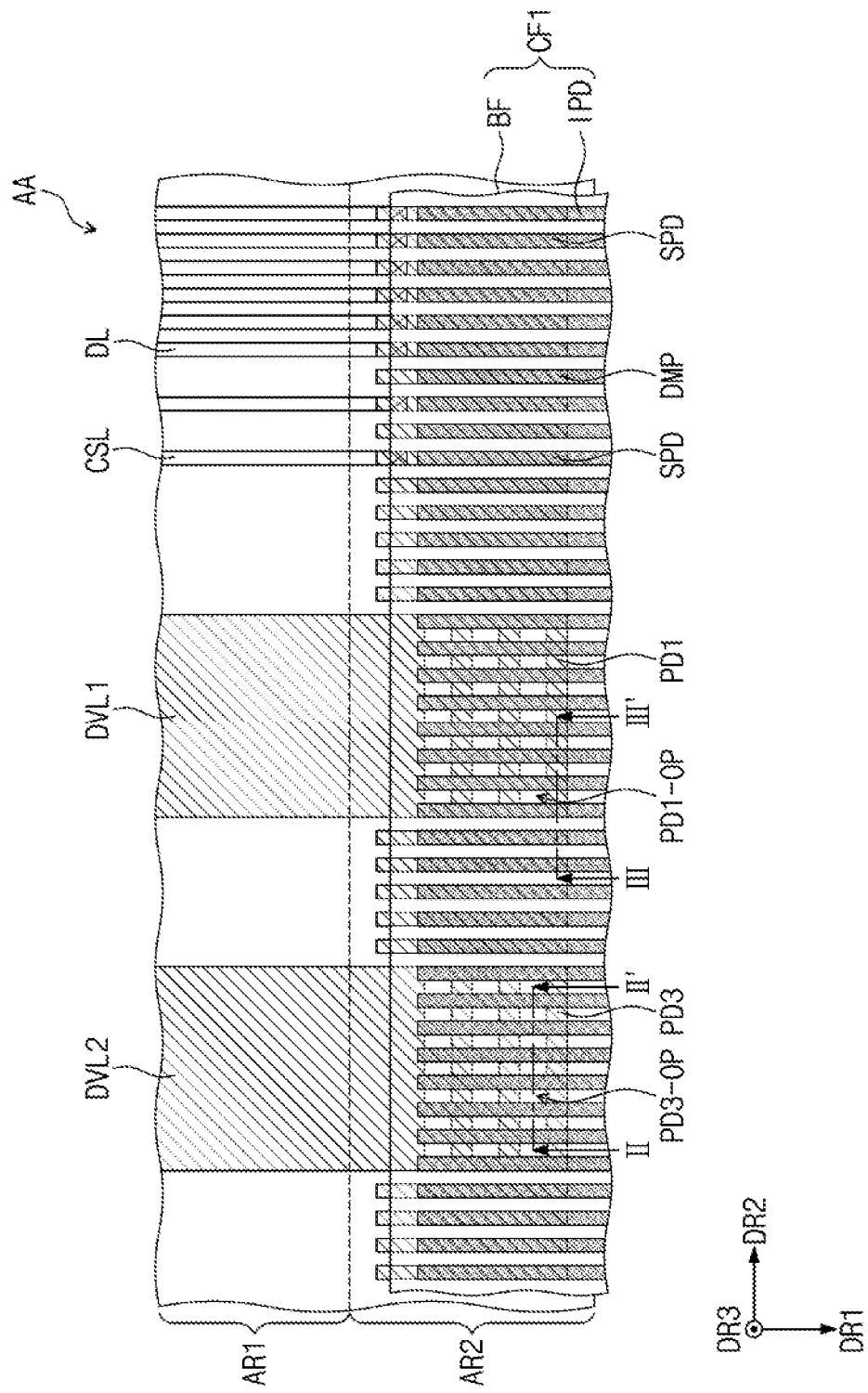

FIGS. 6A and 6B are enlarged plan views illustrating a portion (e.g., taken along a line AA of FIG. 4) of a display apparatus according to an embodiment of the inventive concept. FIG. 6A illustrates an example, in which the first circuit substrate CF1 is not yet bonded to the display panel DP, and FIG. 6B illustrates another example, in which the first circuit substrate CF1 is bonded to the display panel DP.

Referring to FIGS. 4, 6A, and 6B, each of the first and third power pads PD1 and PD3 may overlap at least two pads of the connection pads IPD. In this case, the first and third power pads PD1 and PD3 may include overlap regions OA, which overlap the connection pads IPD, and non-overlap regions NOA, which are not overlapped with the connection pads IPD, when viewed in a plan view. The overlap regions OA and the non-overlap regions NOA, which are defined in each of the first and third power pads PD1 and PD3, may be alternately arranged in the second direction DR2.

Widths of end portions of the first and third power pads PD1 and PD3, which is connected to the first and second power lines DVL1 and DVL2, may be substantially equal to widths of opposite end portions of the first and third power pads PD1 and PD3, which is opposite to the end portions.

First openings PD1-OP may be defined in the first power pad PD1 connected to the first power line DVL1, and third openings PD3-OP may be defined in the third power pad PD3 connected to the second power line DVL2. Although not shown, second openings may be defined in the second power pad PD2, and fourth openings may be defined in the fourth power pad PD4.

The second and fourth power pads PD2 and PD4 may be configured to have substantially the same features as the first and third power pads PD1 and PD3, respectively. Therefore, the description of the second and fourth power pads PD2 and PD4 may be omitted.

The first openings PD1-OP may be spaced apart from each other by a specific distance in each of the first and second directions DR1 and DR2 in the first power pad PD1. In the third power pad PD3, the third openings PD3-OP may be spaced apart from each other by a specific distance in each of the first and second directions DR1 and DR2.

Each of the first and third openings PD1-OP and PD3-OP may be arranged side by side in the first direction DR1 and the second direction DR2.

When viewed in a plan view, the first and third openings PD1-OP and PD3-OP may not overlap the connection pads IPD and may be defined in the non-overlap regions NOA of the first and third power pads PD1 and PD3 between the connection pads IPD.

The first openings PD1-OP and the third openings PD3-OP may be provided in each of the non-overlap regions NOA to be spaced apart from each other by a specific distance in the first direction DR1.

Accordingly, a display apparatus (e.g., display apparatus DD) may include a display panel (e.g., display panel DP) including one or more pads (e.g., first and third power pads PD1 and PD3), wherein each of the pads includes one or more openings (e.g., first and third openings PD1-OP and PD3-OP); an electronic component (e.g., including first circuit substrate CF1) including a plurality of connection pads (e.g., connection pads IPD) in contact with the pads, wherein each of the pads overlaps at least two pads of the connection pads; and a gap-fill layer (e.g., gap-fill layer FL of FIG. 7) disposed between the display panel and the electronic component, between the connection pads, and in the openings, wherein each of the openings overlaps a region (e.g., non-overlapping regions NOA) between the connection pads and is configured to enable curing of the gap-fill layer.

Figure 7:
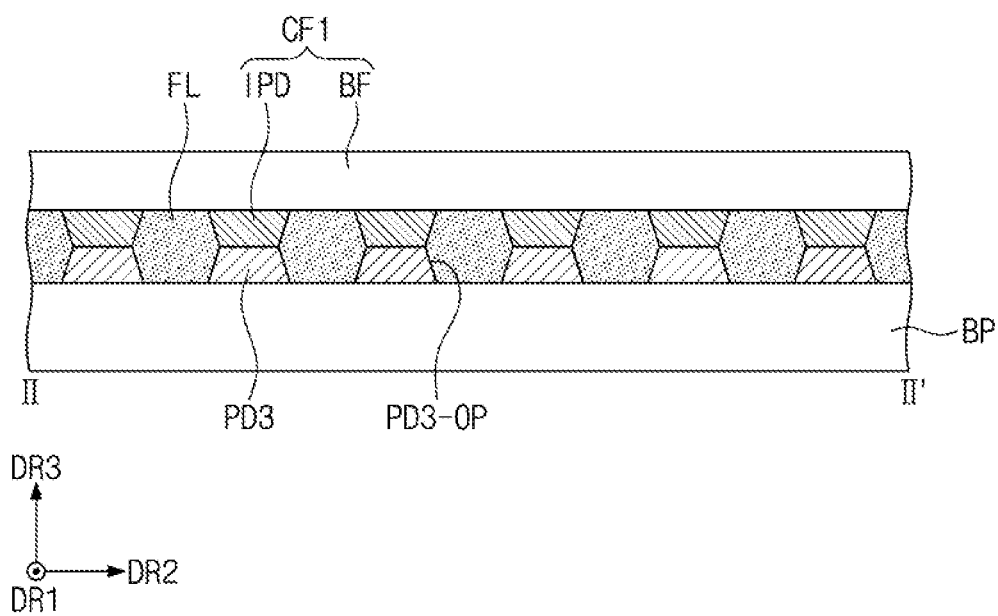
FIG. 7 is a sectional view taken along a line II-II' of FIG. 6B.
Figure 8:
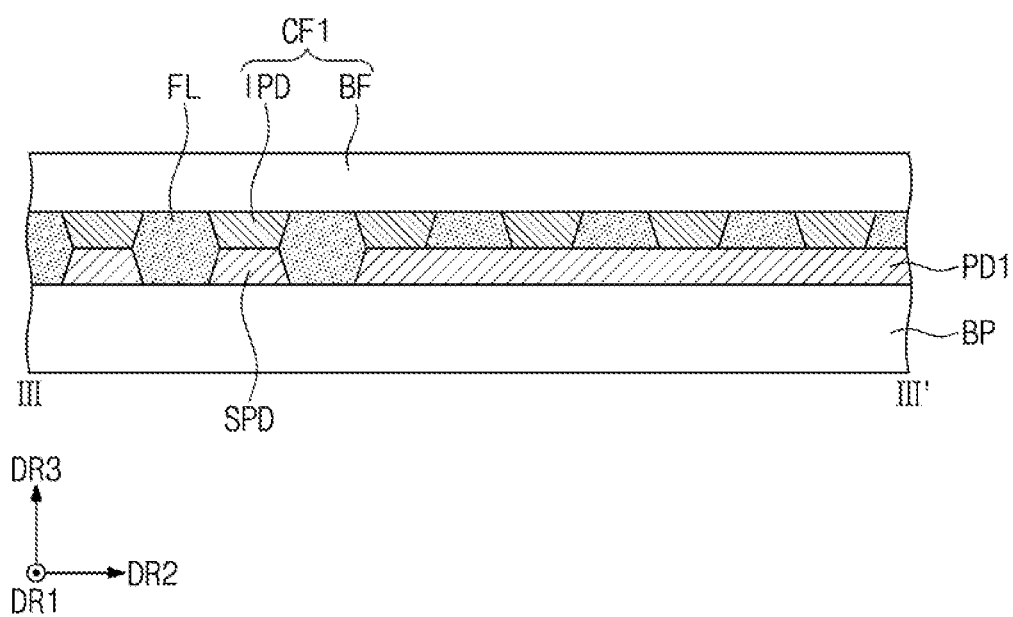
FIG. 8 is a sectional view taken along a line of FIG. 6B.

FIG. 7 is a sectional view taken along a line II-IP of FIG. 6B, and FIG. 8 is a sectional view taken along a line of FIG. 6B.

Referring to FIGS. 7 and 8, the display apparatus DD according to an embodiment of the inventive concept may further include a gap-fill layer FL, which is disposed between the display panel DP and the first circuit substrate CF1.

The gap-fill layer FL may be provided between the connection pads IPD, between the signal pads SPD, between the first and third power pads PD1 and PD3, and in the first and third openings PD1-OP and PD3-OP, after the bonding between the first circuit substrate CF1 and the display panel DP. Although not shown, the gap-fill layer FL may also be provided between the second and fourth power pads and in the second and fourth openings. The gap-fill layer FL may be referred to as an underfill resin.

The gap-fill layer FL may be an insulating resin with a non-conductive property. In the present embodiment, the gap-fill layer FL may be provided in the form of an adhesive resin containing a photo-initiator. A curing property of the gap-fill layer FL may be changed, when external light is incident into the gap-fill layer FL. Here, the external light may be, for example, ultraviolet (UV) light.

The gap-fill layer FL may be provided to fill a space between the display panel DP and the first circuit substrate CF1, and in an embodiment, the bonding reliability between the display panel DP and the first circuit substrate CF1 may be increased, due to the gap-fill layer FL.

In an embodiment, since the openings are formed in the power pads PD1, PD2, PD3, and PD4, it may be possible to cure the gap-fill layer FL, which is provided in regions overlapped with the power pads PD1, PD2, PD3, and PD4. In the case to cure the gap-fill layer FL in a photo-curing manner, an external light is irradiated to the display panel DP through its bottom surface, the external light may be incident into the gap-fill layer FL, which are provided in regions overlapped with the power pads PD1, PD2, PD3, and PD4, through the openings. Accordingly, even when a plurality of the connection pads IPD are electrically connected to each of the power pads PD1, PD2, PD3, and PD4, it may be possible to increase the bonding reliability between the display panel DP and the first circuit substrate CF1.

Figure 9:
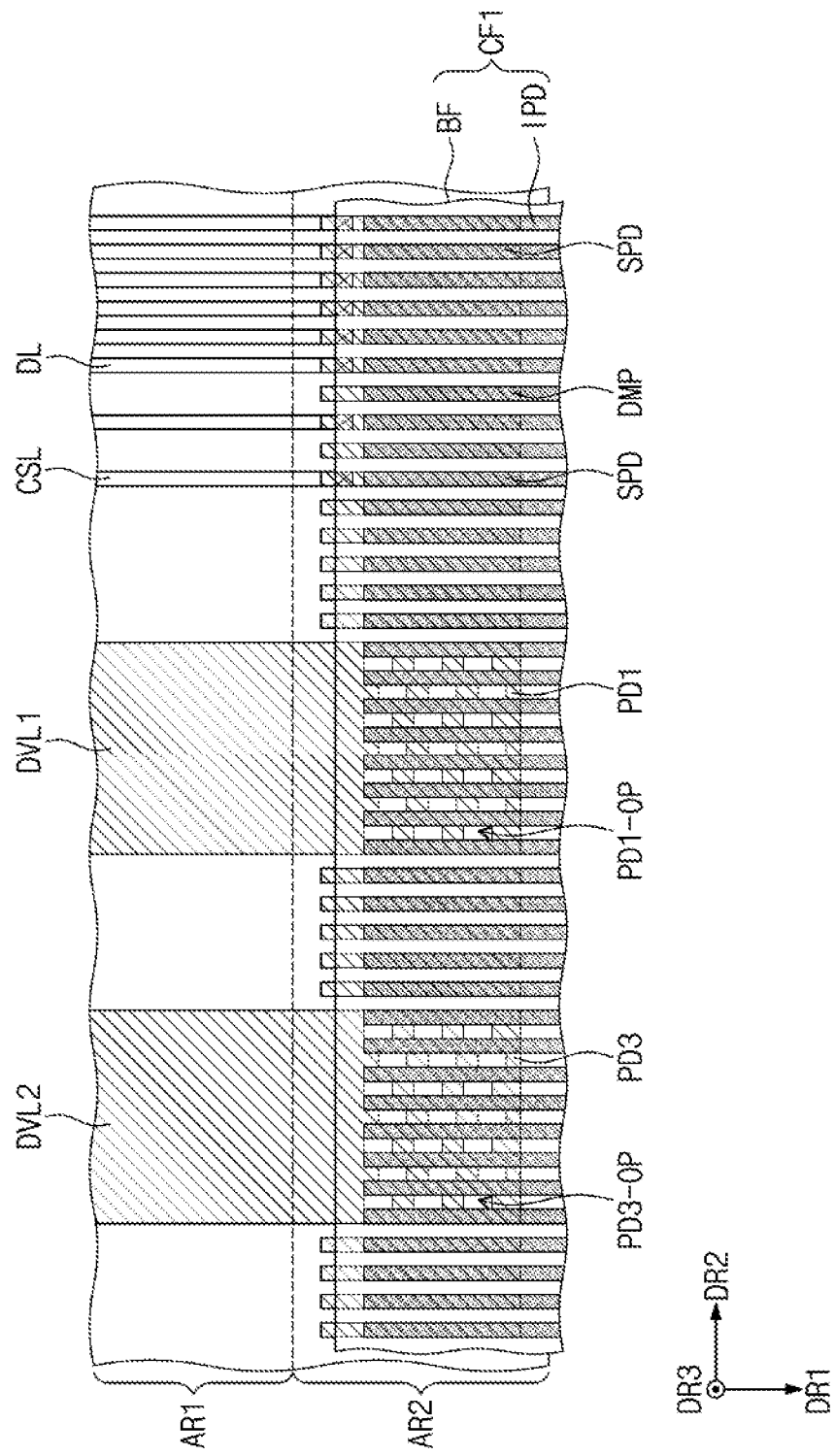
FIG. 9 is an enlarged plan view illustrating a portion (e.g., taken along the line AA of FIG. 4) of a display apparatus according to an embodiment of the inventive concept.

FIG. 9 is an enlarged plan view illustrating a portion (e.g., taken along the line AA of FIG. 4) of a display apparatus according to an embodiment of the inventive concept. In the following description of FIG. 9, an element previously described with reference to FIGS. 6A and 6B may be identified by the same reference number without repeating an overlapping description thereof.

Referring to FIGS. 4 and 9, the first openings PD1-OP in the first power pad PD1 may be spaced apart from each other by a specific distance in each of the first and second directions DR1 and DR2. In the third power pad PD3, the third openings PD3-OP may be spaced apart from each other by a specific distance in each of the first and second directions DR1 and DR2.

the first and third openings PD1-OP and PD3-OP may be arranged to form a zigzag shape in the second direction DR2. In this case, the gap-fill layer FL, which is provided in the first and third openings PD1-OP and PD3-OP, may be cured to form the zigzag arrangement in the second direction DR2, and this makes it possible to more effectively increase the bonding reliability between the display panel DP and the first circuit substrate CF1.

Figure 10:
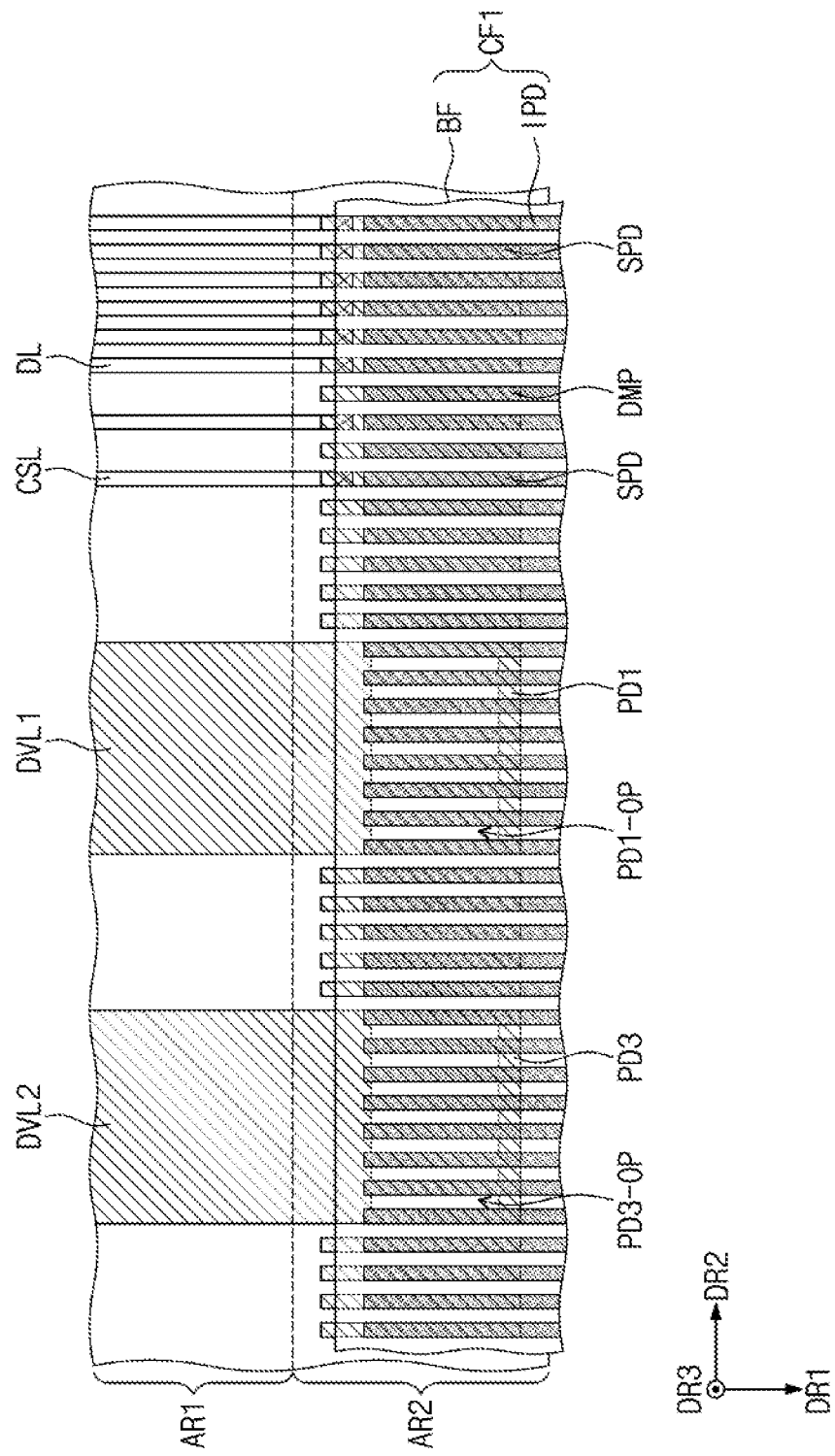
FIG. 10 is an enlarged plan view illustrating a portion (e.g., taken along the line AA of FIG. 4) of a display apparatus according to an embodiment of the inventive concept.

FIG. 10 is an enlarged plan view illustrating a portion (e.g., taken along the line AA of FIG. 4) of a display apparatus according to an embodiment of the inventive concept. In the following description of FIG. 10, an element previously described with reference to FIGS. 6A and 6B may be identified by the same reference number without repeating an overlapping description thereof.

In the first power pad PD1, the first openings PD1-OP may be extended in the first direction DR1 and may be spaced apart from each other by a specific distance in the second direction DR2. In the third power pad PD3, the third openings PD3-OP may be extended in the first direction DR1 and may be spaced apart from each other by a specific distance in the second direction DR2.

When viewed in a plan view, each of the first openings PD1-OP may be provided between each pair of the connection pads IPD corresponding to the first power pad PD1, and each of the third openings PD3-OP may be provided between each pair of the connection pads IPD associated with the third power pad PD3.

Since the first and third openings PD1-OP and PD3-OP are extended in the first direction DR1, an area of the gap-fill layer FL, which is provided in regions overlapped with the first and third power pads PD1 and PD3, may be increased. This makes it possible to increase the bonding reliability between the display panel DP and the first circuit substrate CF1.

Figure 11:
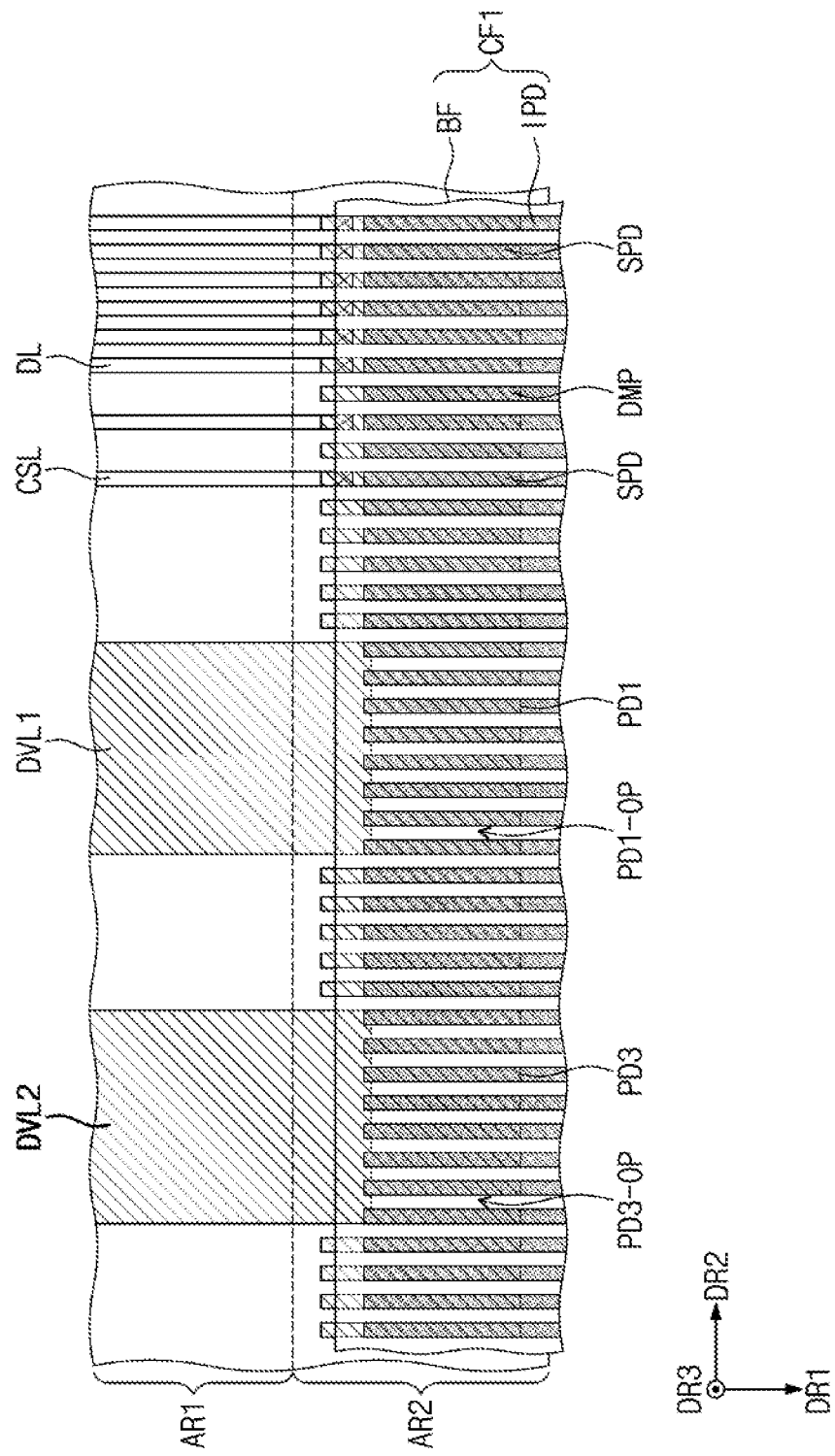
FIG. 11 is an enlarged plan view illustrating a portion (e.g., taken along the line AA of FIG. 4) of a display apparatus according to an embodiment of the inventive concept.

FIG. 11 is an enlarged plan view illustrating a portion (e.g., taken along the line AA of FIG. 4) of a display apparatus according to an embodiment of the inventive concept. In the following description of FIG. 11, an element previously described with reference to FIGS. 6A and 6B may be identified by the same reference number without repeating an overlapping description thereof.

Widths of end portions of the first and third power pads PD1 and PD3, which is connected to the first and second power lines DVL1 and DVL2, may be different from widths of opposite end portions of the first and third power pads PD1 and PD3, which is opposite to the end portions. FIG. 11 illustrates an example in which the end portions of the first and third power pads PD1 and PD3 have widths greater than widths of the opposite end portion of the first and third power pads PD1 and PD3.

The first and third power pads PD1 and PD3 of FIG. 11 may have the same shape as a shape, which is formed by removing portions corresponding to the first and third openings PD1-OP and PD3-OP from the opposite end portions of the first and third power pads PD1 and PD3 of FIG. 10.

In this case, the gap-fill layer FL may be provided in a region, from which the opposite end portions of the first and third power pads PD1 and PD3 are removed. Therefore, it may be possible to increase the bonding reliability between the display panel DP and the first circuit substrate CF1.

According to an embodiment of the inventive concept, a display apparatus may include pads, in which an opening is formed, and in this case, it may be possible to prevent a degradation issue in bonding reliability, which may occur when a gap-fill layer interposed between pads of a display panel and connection pads of an electronic component is insufficiently cured.

While example embodiments of the inventive concepts have been particularly shown and described, it will be understood by one of ordinary skill in the art that variations in form and detail may be made therein without departing from the spirit and scope of the attached claims.

What is claimed is:

1. A display apparatus, comprising:
   a display panel comprising a display region and a peripheral region adjacent to the display region and further comprising lines disposed in the peripheral region, and a plurality of pads which are respectively connected to the lines, and wherein at least one pad of the plurality of pads comprises one or more openings;
   an electronic component including a plurality of connection pads in contact with the at least one pad, wherein the plurality of connection pads are extended in a first direction, and are arranged in a second direction crossing the first direction; and
   a gap-fill layer disposed between the display panel and the electronic component, between the connection pads, between the pads, and in the openings,
   wherein the at least one pad overlaps at least two pads of the connection pads,
   wherein each of the openings overlaps a region between the connection pads in a plan view, wherein the openings of the at least one pad have a same shape and are arranged in a grid pattern comprising a plurality of rows extending in the second direction and a plurality of columns extending in the first direction, wherein each of the plurality of rows and each of the plurality of columns comprises a plurality of the openings, wherein each of the plurality of columns is arranged parallel to a connection pad of the plurality of connection pads, wherein the at least one pad includes a plurality of overlap regions arranged in the second direction and alternating with a plurality of non-overlap regions, wherein each of the plurality of overlap regions is in direct contact with a different connection pad of the plurality of connection pads, and wherein each of the plurality of non-overlap regions overlaps each of the openings within a column of the plurality of columns and does not overlap the plurality of connection pads.

2. The display apparatus of claim 1, wherein the gap-fill layer has a non-conductive property and includes a photo-initiator.

3. The display apparatus of claim 2, wherein the electronic component further comprises a base film, and
the connection pads are disposed on a surface of the base film.

4. The display apparatus of claim 3, wherein the openings in each of the at least one pad are spaced apart from each other by a specific distance in each of the first and second directions.

5. The display apparatus of claim 4, wherein the openings are arranged side by side in the second direction.

6. The display apparatus of claim 5, wherein the openings are arranged in a zigzag shape in the second direction.

7. The display apparatus of claim 3, wherein the openings in the at least one pad are extended in the first direction and are spaced apart from each other by a specific distance in the second direction.

8. The display apparatus of claim 7, wherein widths of end portions of the at least one pad connected to the lines are substantially equal to widths of opposite ends of the at least one pad, which are opposite to the end portions of the pads.

9. The display apparatus of claim 7, wherein widths of end portions of the at least one pad connected to the lines are greater than widths of opposite ends of the at least one pad, which are opposite to the end portions of the at least one pad.

10. A display apparatus, comprising:
a display panel comprising a display region and a peripheral region adjacent to the display region, and further comprising lines disposed in the peripheral region, and a plurality of pads which are respectively connected to the lines, and wherein at least one pad of the plurality of pads includes a plurality of openings;
an electronic component including a plurality of connection pads electrically connected to the at least one pad, wherein the plurality of connection pads are extended in a first direction, and are arranged in a second direction crossing the first direction respectively; and
a gap-fill layer disposed between the display panel and the electronic component and in the openings,
wherein the at least one pad overlaps the plurality of the connection pads,
wherein the openings do not overlap the connection pads, wherein the openings of the at least one pad have a same shape and are arranged in a grid pattern comprising a plurality of rows extending in the second direction and a plurality of columns extending in the first direction, wherein each of the plurality of rows and the plurality of columns comprises a plurality of the openings, wherein each of the plurality of columns is arranged parallel to a connection pad of the plurality of connection pads, wherein the at least one pad includes a plurality of overlap regions arranged in the second direction and alternating with a plurality of non-overlap regions, wherein each of the plurality of overlap regions is in direct contact with a different connection pad of the plurality of connection pads, and wherein each of the plurality of non-overlap regions overlaps each of the openings within a column of the plurality of columns and does not overlap the plurality of connection pads.

11. The display apparatus of claim 10, wherein the gap-fill layer has a non-conductive property and includes a photo-initiator.

12. The display apparatus of claim 10, wherein the at least one pad is in direct contact with the connection pads.

13. A display apparatus, comprising:
a display panel comprising a display region and a peripheral region adjacent to the display region, the display panel further comprising lines disposed in the peripheral region, and a plurality of pads which are respectively connected to the lines; and
an electronic component comprising a plurality of connection pads, wherein the plurality of connection pads are disposed on the at least one pad and in contact with the at least one pad, respectively,
wherein the at least one pad comprises one or more overlap regions that overlap at least two pads of the connection pads,
wherein each of the non-overlap regions of the pads include one or more openings, wherein the one or more openings of the at least one pad of the plurality of pads have a same shape and are arranged in a grid pattern comprising a plurality of rows and a plurality of columns, wherein each of the plurality of rows and the plurality of columns comprises a plurality of the one or more openings, wherein each of the plurality of columns is arranged parallel to a connection pad of the plurality of connection pads,
wherein the at least one pad includes a plurality of overlap regions arranged in the second direction and alternating with a plurality of non-overlap regions, wherein each of the plurality of overlap regions is in direct contact with a different connection pad of the plurality of connection pads, and wherein each of the plurality of non-overlap regions overlaps each of the openings within a column of the plurality of columns and does not overlap the plurality of connection pads.

14. The display apparatus of claim 13, further comprising a gap-fill layer disposed between the display panel and the electronic component, between the connection pads, between the at least one pad, and in the openings.

15. The display apparatus of claim 14, wherein the gap-fill layer has a non-conductive property and includes a photo-initiator.

16. The display apparatus of claim 14, wherein each of the openings in each of the non-overlap regions is extended in the first direction.

17. The display apparatus of claim 13, wherein the at least one pad overlaps a plurality of the connection pads.

18. The display apparatus of claim 17, wherein the electronic component further comprises a base film, and
the connection pads are disposed on a surface of the base film, are extended in a first direction, and are arranged in a second direction crossing the first direction.

19. The display apparatus of claim 18, wherein the overlap regions and the non-overlap regions in the at least one pad are alternately disposed in the second direction.

20. The display apparatus of claim 19, wherein the openings in each of the non-overlap regions are spaced apart from each other by a specific distance in the first direction.

* * * * *